United States Patent
Wang et al.

(10) Patent No.: US 10,903,272 B2
(45) Date of Patent: Jan. 26, 2021

(54) MEMORY DEVICE AND A METHOD FOR FORMING THE MEMORY DEVICE

(71) Applicant: GLOBALFOUNDRIES Singapore Pte. Ltd., Singapore (SG)

(72) Inventors: Lanxiang Wang, Singapore (SG); Shyue Seng Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 19 days.

(21) Appl. No.: 16/205,314

(22) Filed: Nov. 30, 2018

(65) Prior Publication Data
US 2020/0176513 A1 Jun. 4, 2020

(51) Int. Cl.
*H01L 27/24* (2006.01)
*H01L 45/00* (2006.01)

(52) U.S. Cl.
CPC ...... *H01L 27/2463* (2013.01); *H01L 27/2436* (2013.01); *H01L 27/2481* (2013.01); *H01L 45/1633* (2013.01); *H01L 45/122* (2013.01); *H01L 45/1233* (2013.01); *H01L 45/1253* (2013.01); *H01L 45/146* (2013.01)

(58) Field of Classification Search
CPC ............. H01L 27/2463; H01L 45/1633; H01L 27/2436; H01L 27/2481; H01L 45/146; H01L 45/1233
See application file for complete search history.

(56) References Cited

U.S. PATENT DOCUMENTS

| 8,962,385 B2 | 2/2015 | Hong et al. | |
| 2014/0050015 A1* | 2/2014 | Katoh | G11C 13/004 |
| | | | 365/148 |
| 2019/0067373 A1* | 2/2019 | Yang | H01L 45/1253 |
| 2019/0088325 A1* | 3/2019 | Wu | G11C 13/0059 |

OTHER PUBLICATIONS

Z. Wei et al., "Highly Reliable TaOx ReRAM and Direct Evidence of Redox Reaction Mechanism", 2008 IEEE International Electron Devices Meeting, 2008, IEEE.
(Continued)

*Primary Examiner* — Patricia D Reddington
(74) *Attorney, Agent, or Firm* — Viering Jentschura & Partner MBB

(57) ABSTRACT

A memory device may include a substrate having conductivity regions and a channel region. A first voltage line may be arranged over the channel region. A second voltage line, and third and fourth voltage lines may be electrically coupled to a first conductivity region and a second conductivity region respectively. Resistive units may be arranged between the third and fourth voltage lines and the second conductivity region. In use, changes in voltages applied between the second and third voltage lines, and between the second and fourth voltage lines may cause resistances of first and second resistive units to switch between lower and higher resistance values. The lower resistance value of the first resistive unit may be different from the lower resistance value of the second resistive unit and/or the higher resistance value of the first resistive unit may be different from the higher resistance value of the second resistive unit.

18 Claims, 11 Drawing Sheets

(56) References Cited

OTHER PUBLICATIONS

Yuan Heng Tseng et al., "High Density and Ultra Small Cell Size of Contact ReRAM (CR-RAM) in 90nm CMOS Logic Technology and Circuits", 2009 IEEE International Electron Devices Meeting (IEDM), 2009, pp. 5.6.1-5.6.4, IEEE.

M. J. Kim et al., "Low Power Operating Bipolar TMO ReRAM for Sub 10 nm Era", 2010 International Electron Devices Meeting, 2010, pp. 19.3.1-19.3.4, IEEE.

Soo Gil Kim et al., "Improvement of Characteristics of NbO2 Selector and Full Integration of 4F2 2x-nm tech 1S1R ReRAM", 2015 IEEE International Electron Devices Meeting (IEDM), 2015, pp. 10.3.1-10.3.4, IEEE.

M. Nakayama, "ReRAM technologies: Applications and outlook", 2017 IEEE International Memory Workshop (IMW), 2017, IEEE.

H. Y. Lee et al, "Low Power and High Speed Bipolar Switching with A Thin Reactive Ti Buffer Layer in Robust HfO2 Based RRAM", 2008 IEEE International Electron Devices Meeting, 2008, IEEE.

Young Yang Liauw et al., "Nonvolatile 3D-FPGA With Monolithically Stacked RRAM-Based Configuration Memory", 2012 IEEE International Solid-State Circuits Conference, ISSCC 2012 / Session 23 / Advances in Heterogeneous Integration / 23.4, 2012, pp. 406-408, IEEE.

AMR M.S.Tosson et al., "1T2R: A Novel Memory Cell Design to Resolve Single-Event Upset in RRAM Arrays", 2017 IEEE 12th International Conference on ASIC (ASICON), 2017, pp. 12-15, IEEE.

\* cited by examiner

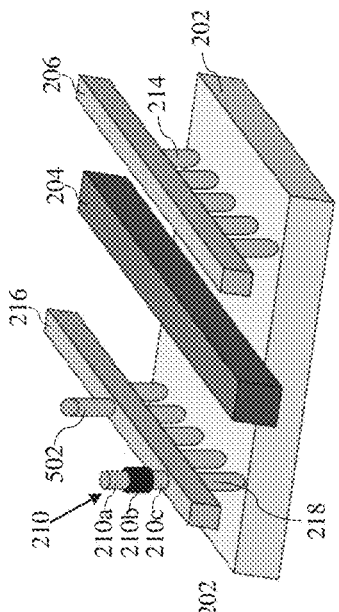
FIG. 6A
FIG. 6B
FIG. 6C
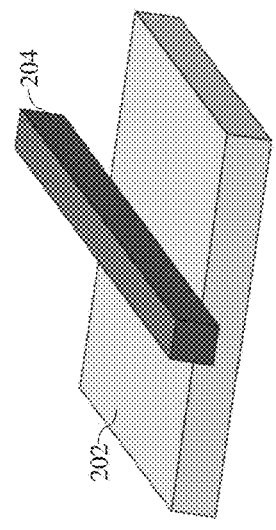
FIG. 6D
FIG. 6E
FIG. 6F

MEMORY DEVICE AND A METHOD FOR FORMING THE MEMORY DEVICE

TECHNICAL FIELD

The present disclosure relates generally to memory devices and methods for forming the memory devices.

BACKGROUND

Non-volatile memory devices are often used in various consumer electronic products such as smart phones and tablets. There are various types of non-volatile memory devices such as resistive random access memory devices (ReRAMs), magnetic random access memory devices (MRAMs) and phase-change magnetic random access memory devices (PCRAMs).

ReRAMs generally operate with a fast speed and low operation voltage. Further, the process of forming ReRAMs usually has a low process complexity. Therefore, ReRAMs are useful for high-density and high-speed non-volatile memory applications. A ReRAM typically uses a resistive layer such as a dielectric layer sandwiched between a top electrode and a bottom electrode. The resistive layer is normally insulating. However, upon application of a sufficiently high voltage difference between the top and bottom electrodes, a dielectric breakdown event can occur and this can in turn form a conducting filament between the top and bottom electrodes. The resistive layer thus becomes conductive via the conducting filament. The resistive layer can be made insulating again by applying a sufficiently low voltage difference to the top and bottom electrodes to break the conducting filament. A conventional ReRAM can switch between states based on the resistance of the resistive layer. When the resistive layer is insulating, the resistive layer has a high resistance (in other words, is in a high resistance state (HRS)) and the ReRAM is in a high (H(01)) state. When the resistive layer is conductive, the resistive layer has a low resistance (in other words, is in a low resistance state (LRS)) and the ReRAM is in a low (L(00)) state. To set the ReRAM, the ReRAM is switched from the high (H(01)) state to the low (L(00)) state, whereas to reset the ReRAM, the ReRAM is switched from the low (L(00)) state to the high (H(01)) state. The setting and resetting of the ReRAM is done by applying predetermined voltage differences to the top and bottom electrodes to form and break the conducting filament.

To date, several types of ReRAMs have been developed, some of which have been commercialized. For example, FIGS. 1A and 1B show a perspective view and an equivalent circuit of a prior art ReRAM 100 respectively. The ReRAM 100 includes a substrate 102 including a source region, a drain region and a channel region (not shown in the figures). A bit line (BL) 106 is electrically coupled to the drain region, a source line (SL) 108 is electrically coupled to the source region and a word line (WL) 104 is arranged over the channel region between the source and drain regions. ReRAM 100 further includes a resistive unit (RU) 110 arranged between the source line 108 and the source region. The resistive unit 110 includes a resistive layer sandwiched between a top electrode and a bottom electrode. To set the ReRAM 100, a voltage of 2.5V is applied to the source line 108 to switch the ReRAM 100 to the low (L(00)) state. To reset the ReRAM 100, a voltage of 1.25V is applied to the source line 108 to switch the ReRAM 100 to the high (H(01)) state. During the set and reset operations, the write line 104 is kept at a constant voltage of 2.5V and the bit line 106 is kept at a constant voltage of 0V. To read the ReRAM 100, a voltage $V_{DD}$ is applied to the write line 104, a voltage of 0V is applied to the source line 108 and a voltage of 0.1V is applied to the bit line 106.

Although prior art memory devices, such as ReRAM 100, can function as high speed non-volatile memory devices, they are only capable of switching between two states and hence, the types of applications in which they can be used are limited. Accordingly, it is desirable to provide an improved memory device that can be used in a greater number of applications.

SUMMARY

According to various non-limiting embodiments, there may be provided a memory device including a substrate that may include a first conductivity region and a second conductivity region that may be at least partially arranged within the substrate, and a channel region that may be arranged between the first conductivity region and the second conductivity region; a first voltage line that may be arranged over the channel region; a second voltage line that may be electrically coupled to the first conductivity region; a third voltage line and a fourth voltage line that may be electrically coupled to the second conductivity region; and two or more resistive units including a first resistive unit and a second resistive unit. The first resistive unit may be arranged between the third voltage line and the second conductivity region. The second resistive unit may be arranged between the fourth voltage line and the second conductivity region. The first resistive unit may have a resistance configured to switch between a first resistance value and a second resistance value in response to a change in voltage applied between the second voltage line and the third voltage line. The second resistive unit may have a resistance configured to switch between a third resistance value and a fourth resistance value in response to a change in voltage applied between the second voltage line and the fourth voltage line. The first resistance value may be lower than the second resistance value and the third resistance value may be lower than the fourth resistance value. The first resistance value may be different from the third resistance value and/or the second resistance value may be different from the fourth resistance value.

According to various non-limiting embodiments, there may be provided a method including providing a substrate including a first conductivity region and a second conductivity region that may be at least partially within the substrate. A channel region may be arranged between the first conductivity region and the second conductivity region, and a first voltage line may be formed over the channel region of the substrate. The method may further include forming a second voltage line over the substrate, and forming a third voltage line, a fourth voltage line, and two or more resistive units including a first resistive unit and a second resistive unit over the substrate. The second voltage line may be electrically coupled to the first conductivity region. The third voltage line and the fourth voltage line may be electrically coupled to the second conductivity region. The first resistive unit may be arranged between the third voltage line and the second conductivity region. The second resistive unit may be arranged between the fourth voltage line and the second conductivity region. The first resistive unit may have a resistance configured to switch between a first resistance value and a second resistance value in response to a change in voltage applied between the second voltage line and the third voltage line. The second resistive unit may have a resistance configured to switch between a third resistance value and a fourth resistance value in response to a change in voltage applied between the second voltage line and the fourth voltage line. The first resistance value may be lower than the second resistance value, the third resistance value may be lower than the fourth resistance value. The first resistance value may be different from the third resistance value and/or the second resistance value may be different from the fourth resistance value.

According to various non-limiting embodiments, there may be provided a memory cell that may include a plurality of memory devices. Each memory device may include a substrate including a first conductivity region and a second conductivity region that may be at least partially arranged within the substrate, and a channel region that may be arranged between the first conductivity region and the second conductivity region. Each memory device may further include a first voltage line that may be arranged over the channel region; a second voltage line that may be electrically coupled to the first conductivity region; a third voltage line and a fourth voltage line that may be electrically coupled to the second conductivity region; and two or more resistive units including a first resistive unit and a second resistive unit. The first resistive unit may be arranged between the third voltage line and the second conductivity region. The second resistive unit may be arranged between the fourth voltage line and the second conductivity region. The first resistive unit may have a resistance configured to switch between a first resistance value and a second resistance value in response to a change in voltage applied between the second voltage line and the third voltage line. The second resistive unit may have a resistance configured to switch between a third resistance value and a fourth resistance value in response to a change in voltage applied between the second voltage line and the fourth voltage line. The first resistance value may be lower than the second resistance value. The third resistance value may be lower than the fourth resistance value. The first resistance value may be different from the third resistance value; and/or the second resistance value may be different from the fourth resistance value.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which:

FIGS. 6A to 6F shows perspective views that illustrate a method for fabricating the memory device of FIG. 5 according to a non-limiting embodiment of the present invention.

DETAILED DESCRIPTION

Figures 1A, 1B:
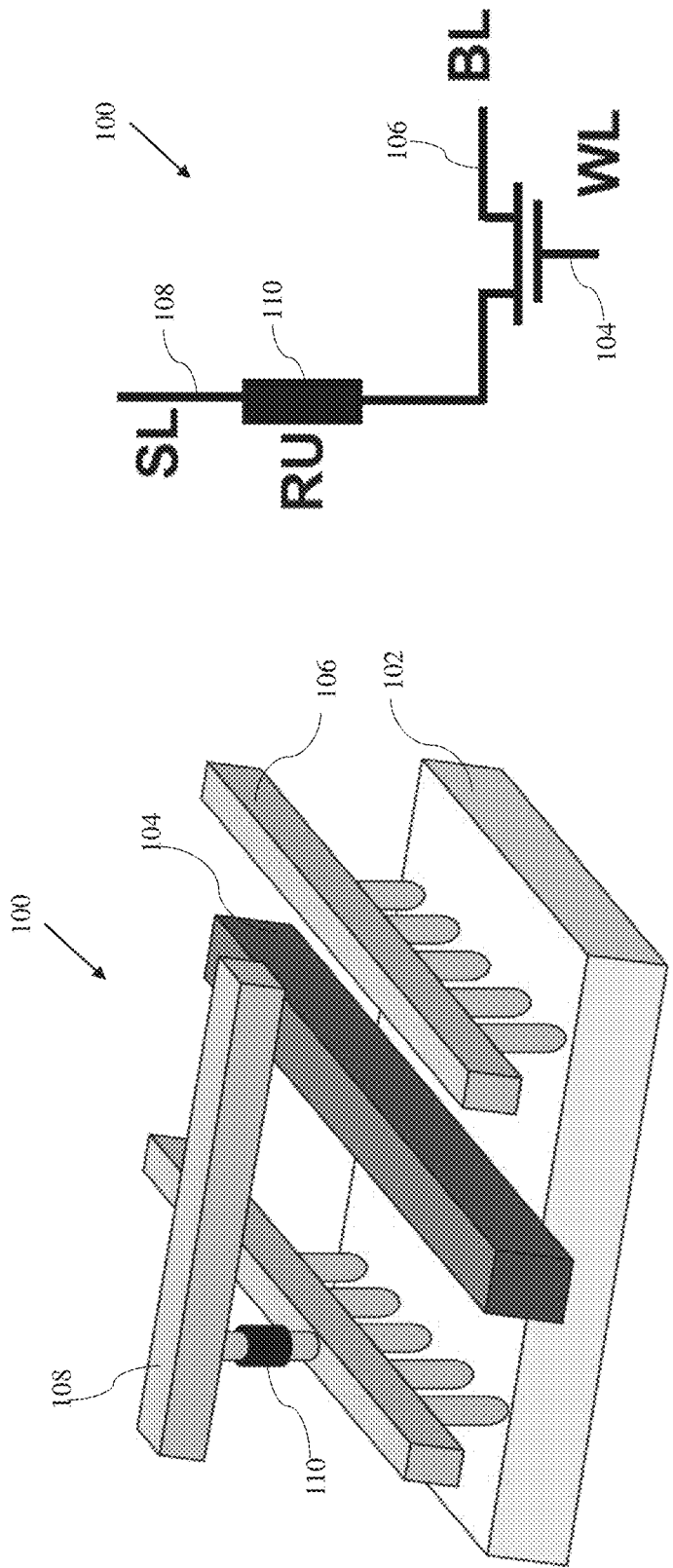
FIGS. 1A and 1B show a perspective view and an equivalent circuit of a prior art ReRAM.

The embodiments generally relate to devices, such as semiconductor devices. More particularly, some embodiments relate to memory devices, for example, non-volatile memory devices such as ReRAMs, MRAMs and PCRAMs. The memory devices may be used to form memory cells that may be employed in memory and neuromorphic applications. The memory devices may also be used for 0.18 um and below technology in a non-limiting embodiment.

According to various non-limiting embodiments, there may be provided a memory device including a substrate that may include a first conductivity region and a second conductivity region that may be at least partially arranged within the substrate, and a channel region that may be arranged between the first conductivity region and the second conductivity region; a first voltage line that may be arranged over the channel region; a second voltage line that may be electrically coupled to the first conductivity region; a third voltage line and a fourth voltage line that may be electrically coupled to the second conductivity region; and two or more resistive units including a first resistive unit and a second resistive unit. The first resistive unit may be arranged between the third voltage line and the second conductivity region. The second resistive unit may be arranged between the fourth voltage line and the second conductivity region. The first resistive unit may have a resistance configured to switch between a first resistance value and a second resistance value in response to a change in voltage applied between the second voltage line and the third voltage line. The second resistive unit may have a resistance configured to switch between a third resistance value and a fourth resistance value in response to a change in voltage applied between the second voltage line and the fourth voltage line. The first resistance value may be lower than the second resistance value and the third resistance value may be lower than the fourth resistance value. The first resistance value may be different from the third resistance value and/or the second resistance value may be different from the fourth resistance value.

According to various non-limiting embodiments, there may be provided a method including providing a substrate including a first conductivity region and a second conductivity region that may be at least partially within the substrate. A channel region may be arranged between the first conductivity region and the second conductivity region, and a first voltage line may be formed over the channel region of the substrate. The method may further include forming a second voltage line over the substrate, and forming a third voltage line, a fourth voltage line, and two or more resistive units including a first resistive unit and a second resistive unit over the substrate. The second voltage line may be electrically coupled to the first conductivity region. The third voltage line and the fourth voltage line may be electrically coupled to the second conductivity region. The first resistive unit may be arranged between the third voltage line and the second conductivity region. The second resistive unit may be arranged between the fourth voltage line and the second conductivity region. The first resistive unit may have a resistance configured to switch between a first resistance value and a second resistance value in response to a change in voltage applied between the second voltage line and the third voltage line. The second resistive unit may have a resistance configured to switch between a third resistance value and a fourth resistance value in response to a change in voltage applied between the second voltage line and the fourth voltage line. The first resistance value may be lower than the second resistance value, the third resistance value may be lower than the fourth resistance value. The first resistance value may be different from the third resistance value and/or the second resistance value may be different from the fourth resistance value.

According to various non-limiting embodiments, the first conductivity region may include a drain region, and the second conductivity region may include a source region.

According to various non-limiting embodiments, the first conductivity region may include a source region, and the second conductivity region may include a drain region.

According to various non-limiting embodiments, the second resistance value may be different from the fourth resistance value, and the first resistance value may be approximately equal to the third resistance value.

According to various non-limiting embodiments, the first resistance value may be different from the third resistance value, and the second resistance value may be different from the fourth resistance value.

According to various non-limiting embodiments, the first resistive unit may have a first diameter, and the second resistive unit may have a second diameter, and the first diameter may be different from the second diameter.

According to various non-limiting embodiments, the first resistive unit may be formed from a first material, and the second resistive unit may be formed from a second material, and the first material may be different from the second material.

According to various non-limiting embodiments, forming a third voltage line, a fourth voltage line, and two or more resistive units including a first resistive unit and a second resistive unit over the substrate may include simultaneously forming the first resistive unit and the second resistive unit over the second conductivity region; and/or simultaneously forming the third voltage line over the first resistive unit and the fourth voltage line over the second resistive unit.

According to various non-limiting embodiments, forming a third voltage line, a fourth voltage line, and two or more resistive units including a first resistive unit and a second resistive unit over the substrate may include forming the first resistive unit over the second conductivity region; forming the third voltage line over the first resistive unit; forming the second resistive unit over the second conductivity region; and forming the fourth voltage line over the second resistive unit.

According to various non-limiting embodiments, there may be provided a memory cell that may include a plurality of memory devices. Each memory device may include a substrate including a first conductivity region and a second conductivity region that may be at least partially arranged within the substrate, and a channel region that may be arranged between the first conductivity region and the second conductivity region. Each memory device may further include a first voltage line that may be arranged over the channel region; a second voltage line that may be electrically coupled to the first conductivity region; a third voltage line and a fourth voltage line that may be electrically coupled to the second conductivity region; and two or more resistive units including a first resistive unit and a second resistive unit. The first resistive unit may be arranged between the third voltage line and the second conductivity region. The second resistive unit may be arranged between the fourth voltage line and the second conductivity region. The first resistive unit may have a resistance configured to switch between a first resistance value and a second resistance value in response to a change in voltage applied between the second voltage line and the third voltage line. The second resistive unit may have a resistance configured to switch between a third resistance value and a fourth resistance value in response to a change in voltage applied between the second voltage line and the fourth voltage line. The first resistance value may be lower than the second resistance value. The third resistance value may be lower than the fourth resistance value. The first resistance value may be different from the third resistance value; and/or the second resistance value may be different from the fourth resistance value.

According to various non-limiting embodiments, for each memory device, either the first conductivity region may include a drain region and the second conductivity region may include a source region, or the first conductivity region may include a source region and the second conductivity region may include a drain region.

According to various non-limiting embodiments, for one or more of the memory devices, the first resistive unit may have a first diameter, and the second resistive unit may have a second diameter, and the first diameter may be different from the second diameter.

According to various non-limiting embodiments, for one or more of the memory devices, the first resistive unit may be formed from a first material, the second resistive unit may be formed from a second material, and the first material may be different from the second material.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 2A:
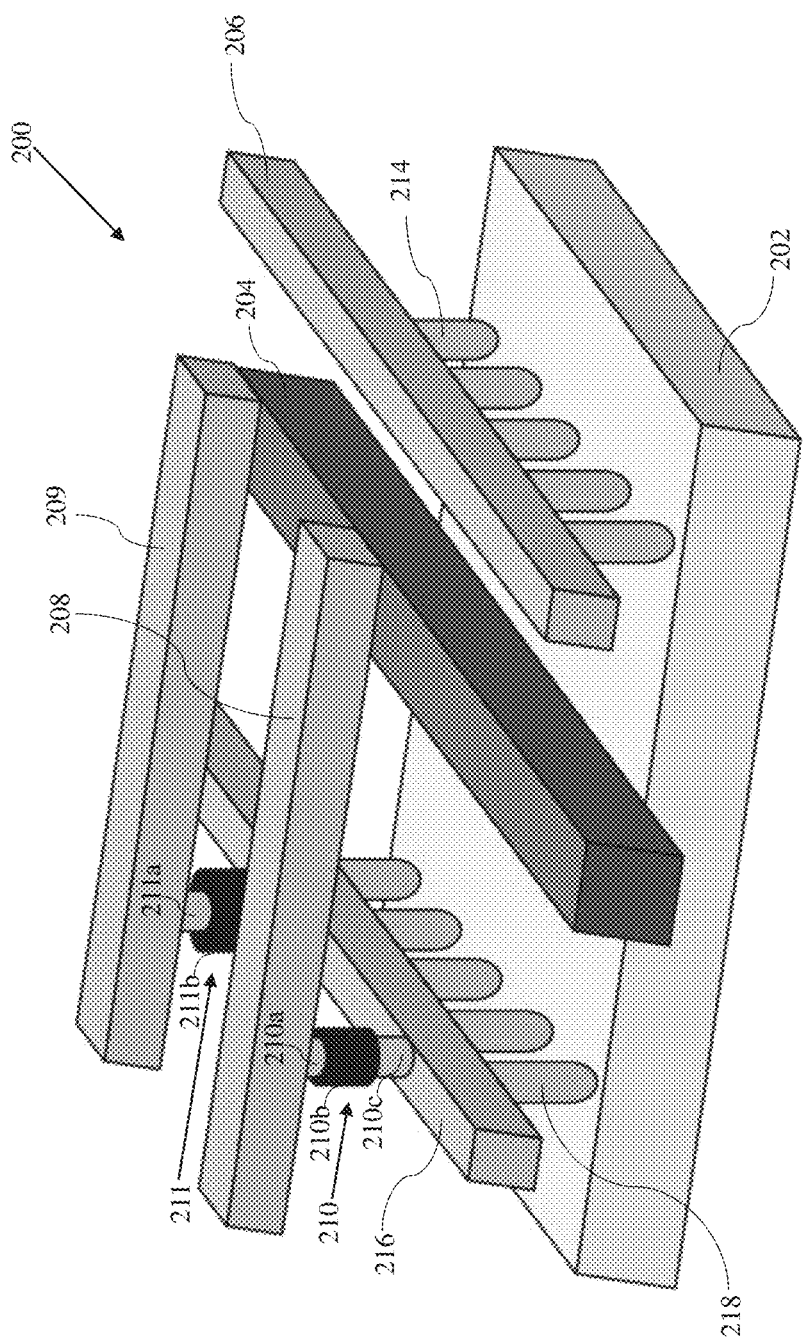
FIGS. 2A, 2B, 2C and 2D show a perspective view, a top view, a cross-sectional view and an equivalent circuit of a memory device according to a non-limiting embodiment of the present invention.
Figure 2B:
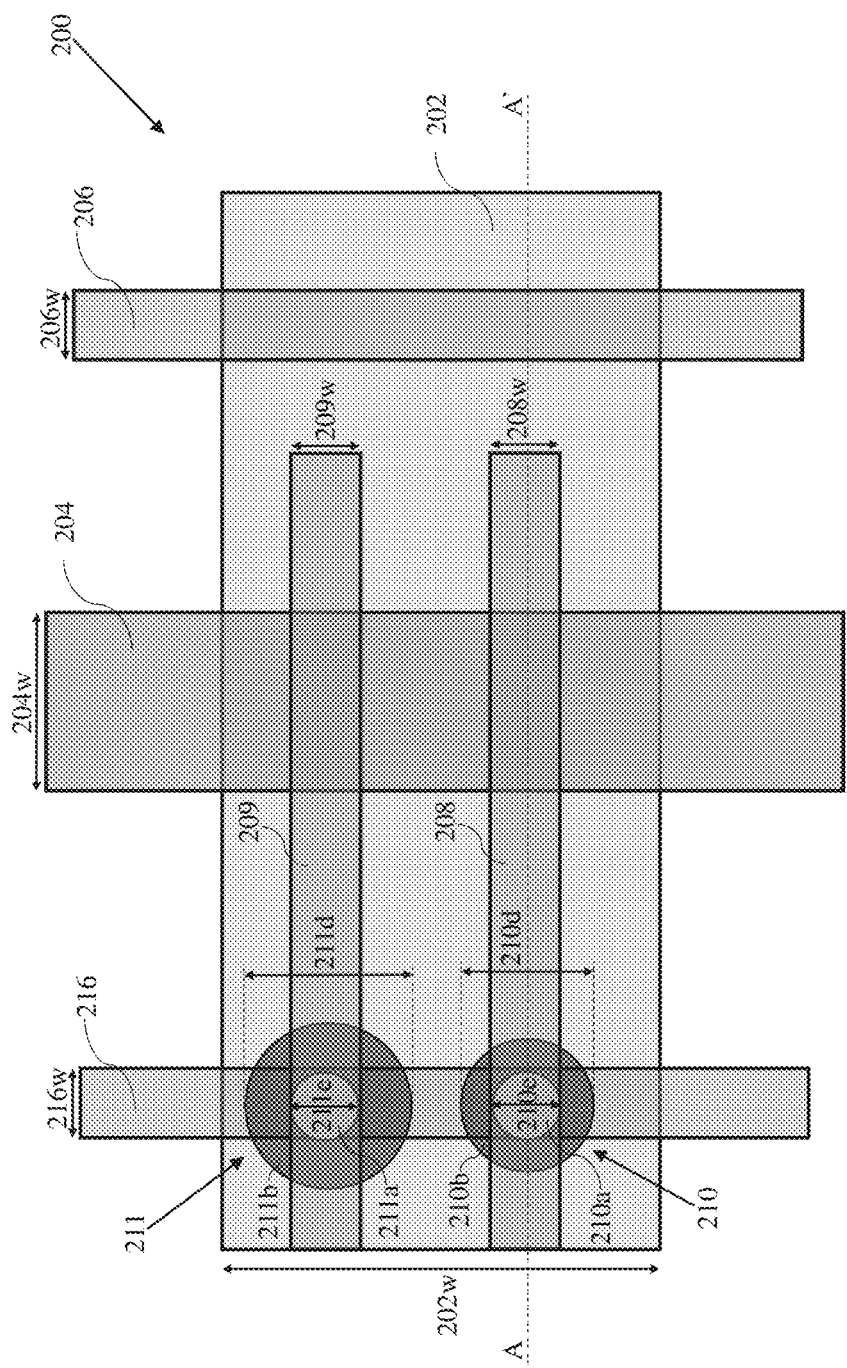
Figure 2C:
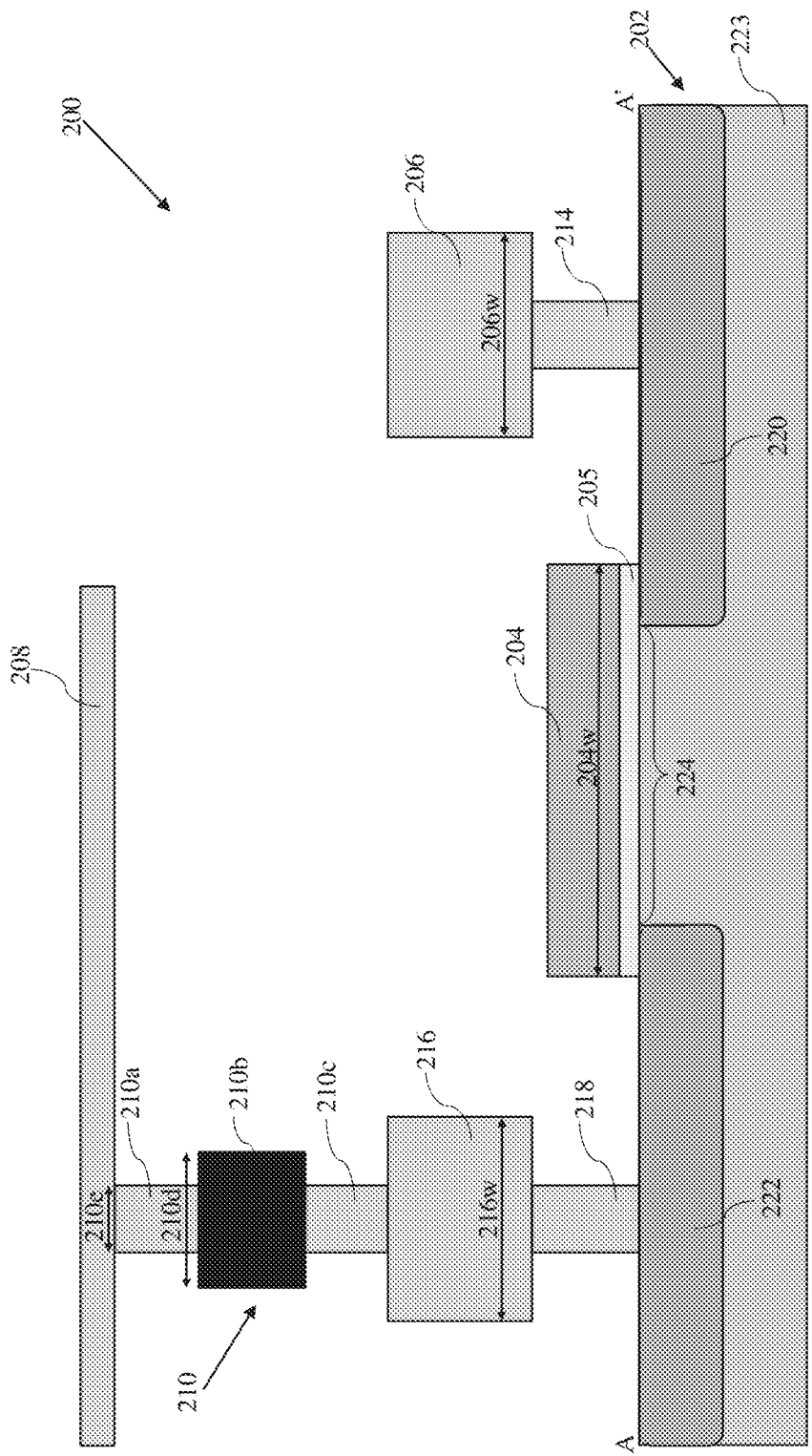
Figure 2D:
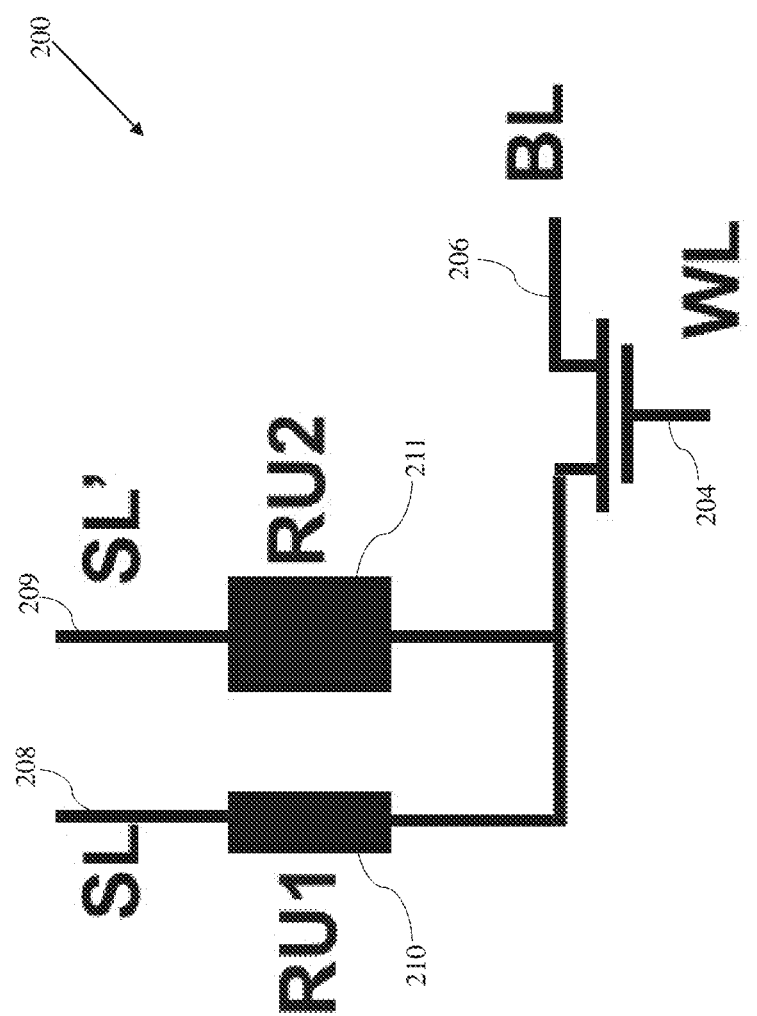

FIG. 2A shows a perspective view of a memory device 200 according to a non-limiting embodiment of the present invention. FIG. 2B shows a top view of the memory device 200 and FIG. 2C shows a cross-sectional view of the memory device 200 along the line A-A'. FIG. 2D shows an equivalent circuit of the memory device 200. In a non-limiting embodiment, the memory device 200 may be in the form of a ReRAM including a metal oxide semiconductor field effect transistor (MOSFET) and may be referred to as a multi-level cell (MLC) ReRAM.

The memory device 200 may include a substrate 202. In various non-limiting embodiments, the substrate 202 may be a bulk substrate or a silicon-on-insulation (SOI) substrate. In various non-limiting embodiments, the substrate 202 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI), silicon germanium substrates, or combinations thereof, and the like. Substrate 202 may in addition or instead include various isolations, dopings, and/or device features. The substrate 202 may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), indium antimonide (InSb), or combinations thereof; an alloy semiconductor including GaAsP, AlInAs, GaInAs, GaInP, GaInAsP, silicon germanium (SiGe), germanium tin (GeSn), silicon germanium tin (SiGeSn), or combinations thereof. Other types of materials as known to those skilled in the art may also be useful for forming the substrate 202. As shown in FIG. 2C, the substrate 202 may include a first conductivity region 220, a second conductivity region 222, a substrate conductivity region 223 and a channel region 224. The first conductivity region 220 and the second conductivity region 222 may be at least partially arranged within the substrate 202. The channel region 224 may be arranged within the substrate 202 between the first conductivity region 220 and the second conductivity region 222.

The memory device 200 may also include a first voltage line 204, a second voltage line 206, a third voltage line 208 and a fourth voltage line 209. The first voltage line 204 may be arranged over the channel region 224. An oxide layer 205 may be arranged between the first voltage line 204 and the substrate 202. The second voltage line 206 may be electrically coupled to the first conductivity region 220 via a plurality of first contact plugs 214. For example, each of the first contact plugs 214 may have one end connected to the first conductivity region 220 and the other end connected to the second voltage line 206. The third voltage line 208 and the fourth voltage line 209 may be electrically coupled to the second conductivity region 222. A first resistive unit 210 may be arranged between the third voltage line 208 and the second conductivity region 222, and a second resistive unit 211 may be arranged between the fourth voltage line 209 and the second conductivity region 222. Said differently, the first and second resistive units 210, 211 may be electrically coupled in parallel to the second conductivity region 222. In a non-limiting embodiment, the memory device 200 may include a plurality of second contact plugs 218 and a conductive line 216. The third voltage line 208 and the fourth voltage line 209 may be electrically coupled to the second conductivity region 222 via the second contact plugs 218, conductive line 216 and the first and second resistive units 210, 211. For example, each of the second contact plugs 218 may have one end connected to the second conductivity region 222 and the other end connected to the conductive line 216. The first and second resistive units 210, 211 may be arranged above the conductive line 216. The first resistive unit 210 may have one end connected to the conductive line 216 and the other end connected to the third voltage line 208, and the second resistive unit 211 may have one end connected to the conductive line 216 and the other end connected to the fourth voltage line 209.

In a non-limiting embodiment as shown in FIGS. 2A-2D, the first conductivity region 220 may include a drain region and the second conductivity region 222 may include a source region. In this non-limiting embodiment, the first voltage line 204 may include a word line (WL), the second voltage line 206 may include a bit line (BL), the third voltage line 208 may include a first source line (SL) and the fourth voltage line 209 may include a second source line (SL'). However, in an alternative non-limiting embodiment, the first conductivity region 220 may include a source region and the second conductivity region 222 may include a drain region. In this alternative non-limiting embodiment, the first voltage line 204 may include a word line (WL), the second voltage line 206 may include a source line (SL), the third voltage line 208 may include a first bit line (BL) and the fourth voltage line 209 may include a second bit line (BL').

The first resistive unit 210 may include a first top electrode 210a, a first bottom electrode 210c and a first resistive layer 210b arranged between the first top and bottom electrodes 210a, 210c. The second resistive unit 211 may include a second top electrode 211a, a second bottom electrode 211c and a second resistive layer 211b arranged between the second top and bottom electrodes 211a, 211c. The first and second resistive units 210, 211 of the memory device 200 may be formed of the same material. For example, the first and second resistive layers 210b, 211b may be formed of the same material, the first and second top electrodes 210a, 211a may be formed of the same material or of different materials, and the first and second bottom electrodes 210c, 211c may be formed of the same material or of different materials. In a non-limiting embodiment, the first and second resistive layers 210b, 211b may include transition metal oxide, such as, but not limited to, tantalum oxide (TaO$_x$), titanium oxide (TiO$_x$), titanium oxy nitride (TiON), silicon oxide (SiO$_x$), aluminium oxide (AlO$_x$), niobium oxide (NbO$_x$), hafnium oxide (HfO$_x$) and combinations thereof. In a non-limiting embodiment, the first and second top electrodes 210a, 211a, and the first and second bottom electrodes 210c, 211c may be formed of platinum, iridium, tantalum, titanium nitride, alloys thereof or combinations thereof. Other types of materials as known to those skilled in the art may also be useful for forming the first and second resistive layers 210b, 211b, the first and second top electrodes 210a, 211a and the first and second bottom electrodes 210c, 211c.

The first resistive unit 210 may have a resistance configured to switch between a first resistance value (LR1) and a second resistance value (HR1) in response to a change in voltage applied between the second voltage line 206 and the third voltage line 208. The first resistance value (LR1) may be lower than the second resistance value (HR1). Similarly, the second resistive unit 211 may have a resistance configured to switch between a third resistance value (LR2) and a fourth resistance value (HR2) in response to a change in voltage applied between the second voltage line 206 and the fourth voltage line 209. The third resistance value (LR2) may be lower than the fourth resistance value (HR2). In a non-limiting embodiment, the first resistance value (LR1) may be approximately equal to the third resistance value (LR2), and the second resistance value (HR1) may be different from the fourth resistance value (HR2). In an alternative non-limiting embodiment, the first resistance value (LR1) may be different from the third resistance value (LR2), and the second resistance value (HR1) may also be different from the fourth resistance value (HR2). In yet another alternative embodiment, the first resistance value (LR1) may be different from the third resistance value (LR2), and the second resistance value (HR1) may be approximately equal to the fourth resistance value (HR2).

For example, in a non-limiting embodiment as shown in FIG. 2B, the first resistive unit 210 may have a first diameter 210d and the second resistive unit 211 may have a second diameter 211d, and the first diameter 210d may be different from the second diameter 211d. To elaborate, the first top electrode 210a, second top electrode 211a, first bottom electrode 210c, second bottom electrode 211c, first resistive layer 210b and second resistive layer 211b may all have a cylindrical shape. However, while the electrodes 210a, 211a, 210c, 211c may all have approximately a same diameter (e.g. diameter 210e may be approximately equal to diameter 211e), a diameter (e.g. first diameter 210d) of the first resistive layer 210b may be smaller than a diameter (e.g. second diameter 211d) of the second resistive layer 211b. The first resistive layer 210b may in turn have a larger diameter than each of the electrodes 210a, 211a, 210c, 211c. With the differences in the diameters (e.g. first diameter 210d and second diameter 211d) of the first resistive layer 210b and the second resistive layer 211b, the first resistance value (LR1) may be approximately equal to the third resistance value (LR2), whereas the second resistance value (HR1) may be different from the fourth resistance value (HR2). For example, the second resistance value (HR1) of the first resistive unit 210 and the fourth resistance value (HR2) of the second resistive unit 211 may be inversely proportional to their respective cross-sectional areas (which are in turn proportional to the square of the respective diameters 210d, 211d). In other words, the second resistance value (HR1) of the first resistive unit 210 with a smaller diameter 210d may be larger than the fourth resistance value (HR2) of the second resistive unit 211 with a larger diameter 211d. In various non-limiting embodiments, a diameter (e.g. 210e, 211e) of each of the electrodes 210a, 211a, 210c, 211c may range from about 2 nm to about 900 nm. The diameter (e.g. first diameter 210d) of the first resistive layer 210b may be about 0.16 um in a non-limiting embodiment, and may range from about 2 nm to about 900 nm in alternative non-limiting embodiments. The diameter (e.g. second diameter 211d) of the second resistive layer 211b may be about 0.18 um in a non-limiting embodiment and may range from about 2 nm to about 900 nm in alternative non-limiting embodiments.

A width 202w of the substrate 202 may be about 300 nm in a non-limiting embodiment, and may range from about 20 nm to about 900 nm in alternative non-limiting embodiments. The first voltage line 204 may be wider than the second, third and fourth voltage lines 206, 208, 209. A width 204w of the first voltage line 204 may be about 0.27 um in a non-limiting embodiment, and may range from about 2 nm to about 900 nm in alternative non-limiting embodiments. A width 206w of the second voltage line 206 may be about 0.07 um in a non-limiting embodiment, and may range from about 2 nm to about 900 nm in alternative non-limiting embodiments; a width 208w of the third voltage line 208 may be about 0.07 um in a non-limiting embodiment, and may range from about 2 nm to about 900 nm in alternative non-limiting embodiments; and a width 209w of the fourth voltage line 209 may be about 0.07 um in a non-limiting embodiment, and may range from about 2 nm to about 900 nm in alternative non-limiting embodiments. Further, a width 216w of the conductive line 216 may be about 0.07 um in a non-limiting embodiment, and may range from about 2 nm to about 900 nm in alternative non-limiting embodiments.

Each of the first conductivity region 220, second conductivity region 222 and substrate conductivity region 223 may include one or more dopants. In one non-limiting embodiment, the first conductivity region 220 and second conductivity region 222 may have approximately equal doping concentrations (i.e. approximately equal concentrations of dopants). The doping concentrations of the first and second conductivity regions 220, 222 may be higher than the doping concentration of the substrate conductivity region 223. In a non-limiting embodiment, the doping concentration of the first conductivity region 220 may range from about 1e-6S/cm to about 1S/cm, the doping concentration of the second conductivity region 222 may range from about 1e-6S/cm to about 1S/cm, and the doping concentration of the substrate conductivity region 223 may range from about 1e-8S/cm to about 1e2S/cm. The first and second conductivity regions 220, 222 may have a first conductivity type. For example, the first and second conductivity regions 220, 222 may both have a p-type conductivity, in other words, include dopants having a p-type conductivity (e.g. p-type dopants). Alternatively, the first and second conductivity regions 220, 222 may both have an n-type conductivity, in other words, include dopants having an n-type conductivity (e.g. n-type dopants). In a non-limiting embodiment, the substrate conductivity region 223 may have a second conductivity type different from the first conductivity type. For example, when the first and second conductivity regions 220, 222 have a p-type conductivity, the substrate conductivity region 223 may have an n-type conductivity. Alternatively, when the first and second conductivity regions 220, 222 have an n-type conductivity, the substrate conductivity region 223 may have a p-type conductivity. In one example, the implant material for the first and second conductivity regions 220, 222 and the substrate conductivity region 223 may be the same implant material, for example, an epitaxial silicon material in a non-limiting embodiment. The p-type material may be or include, but is not limited to epitaxial silicon germanium and/or the n-type material may be or include, but is not limited to doped silicon material comprising n-type dopants. P-type dopants can for example, include but are not limited to boron (B), aluminium (Al), indium (In) or a combination thereof, while n-type dopants can include carbon (C), phosphorus (P), arsenic (As), antimony (Sb), or a combination thereof. Other types of implant materials and dopants as known to those skilled in the art may also be useful for forming the first and second conductivity regions 220, 222 and substrate conductivity region 223.

In use, the memory device 200 may be switchable between four states LL(00), LH(01), HL(10) and HH(11) as shown in Table 1 below. To elaborate, the memory device 200 may be in the LL(00) state when the resistances of the first and second resistive units 210, 211 have the first resistance value (LR1) and the third resistance value (LR2) respectively. The memory device 200 may be in the LH(01) state when the resistances of the first and second resistive units 210, 211 have the first resistance value (LR1) and the fourth resistance value (HR2) respectively. The memory device 200 may be in the HL(10) state when the resistances of the first and second resistive units 210, 211 have the second resistance value (HR1) and the third resistance value (LR2) respectively. The memory device 200 may be in the HH(11) state when the resistances of the first and second resistive units 210, 211 have the second resistance value (HR1) and the fourth resistance value (HR2) respectively.

TABLE 1

| State of memory device 200 | LL(00) | LH(01) | HL(10) | HH(11) |
|---|---|---|---|---|
| Resistance of first resistive unit 210 | LR1 | LR1 | HR1 | HR1 |
| Resistance of second resistive unit 211 | LR2 | HR2 | LR2 | HR2 |

A change in voltage may be applied between the second voltage line 206 and the third voltage line 208 to switch the resistance of the first resistive unit 210 between the first resistance value (LR1) and the second resistance value (HR1). Similarly, a change in voltage may be applied between the second voltage line 206 and the fourth voltage line 209 to switch the resistance of the second resistive unit 211 between the third resistance value (LR2) and the fourth resistance value (HR2). In a non-limiting embodiment as shown in Table 2 below, a voltage at the first voltage line 204 may be kept constant at 2.5V, a voltage at the second voltage line 206 may be kept constant at 0V (in other words, the second voltage line 206 may be grounded) and the resistances of the first and second resistive units 210, 211 may be changed by changing only the voltage applied to the third voltage line 208 or the voltage applied to the fourth voltage line 209. For example, to switch the resistance of the first resistive unit 210 from the second resistance value (HR1) to the first resistance value (LR1) indicated as "Set_1" in Table 2, a voltage of 2.5V may be applied to the third voltage line 208 while the fourth voltage line 209 is floating. To switch the resistance of the second resistive unit 211 from the fourth resistance value (HR2) to the third resistance value (LR2) indicated as "Set_2" in Table 2, a voltage of 2.5V may be applied to the fourth voltage line 209 while the third voltage line 208 is floating. To switch the resistance of the first resistive unit 210 from the first resistance value (LR1) to the second resistance value (HR1) indicated as "Reset_1" in Table 2, a voltage of 1.25V may be applied to the third voltage line 208 while the fourth voltage line 209 is floating. To switch the resistance of the second resistive unit 211 from the third resistance value (LR2) to the fourth resistance value (HR2) indicated as "Reset_2" in Table 2, a voltage of 1.25V may be applied to the fourth voltage line 209 while the third voltage line 208 is floating. However, in alternative non-limiting embodiments, the memory device 200 may be switched between the four states LL(00), LH(01), HL(10) and HH(11) by changing not only the voltage applied to the third voltage line 208 or the voltage applied to the fourth voltage line 209, but also the voltage applied to the second voltage line 206. Further, in various alternative non-limiting embodiments, other voltages may be applied to the voltage lines to switch the memory device 200 between the four states LL(00), LH(01), HL(10) and HH(11). As shown in Table 2, in a non-limiting embodiment, to read the memory device 200, a voltage of $V_{DD}$ may be applied to the first voltage line 204, a voltage of 0.1V may be applied to the second voltage line 206 and a voltage of 0V may be applied to both the third and fourth voltage lines 208, 209. However, other voltages may be applied to read the memory device 200 in other non-limiting embodiments.

TABLE 2

|  | Set_1 | Set_2 | Reset_1 | Reset_2 | Read |
|---|---|---|---|---|---|
| Voltage at first voltage line 204 |  | 2.5 V |  |  | $V_{DD}$ |
| Voltage at second voltage line 206 |  | 0 V |  |  | 0.1 V |
| Voltage at third voltage line 208 | 2.5 V | Floating | 1.25 V | Floating | 0 V |
| Voltage at fourth voltage line 209 | Floating | 2.5 V | Floating | 1.25 V | 0 V |
| Change in resistance of the first resistive unit 210 | HR1 to LR1 | No change | LR1 to HR1 | No change | No change |
| Change in resistance of the second resistive unit 211 | No change | HR2 to LR2 | No change | LR2 to HR2 | No change |

Referring to Tables 1 and 2, in a non-limiting embodiment, the memory device 200 may thus be switched between the four states LL(00), LH(01), HL(10) and HH(11) by changing the voltages applied to the third and fourth voltage lines 208, 209. For example, to switch the memory device 200 from the LL(00) state to the LH(01) state, a voltage of 1.25V may be applied to the fourth voltage line 209 while the third voltage line 208 is floating to change the resistance of the second resistive unit 211 from the third resistance value (LR2) to the fourth resistance value (HR2). In another non-limiting example, to switch the memory device 200 from the LL(00) state to the HH(11) state, the resistance of the first resistive unit 210 may first be changed from the first resistance value (LR1) to the second resistance value (HR1) and subsequently, the resistance of the second resistive unit 211 may then be changed from the third resistance value (LR2) to the fourth resistance value (HR2).

Figure 3B:
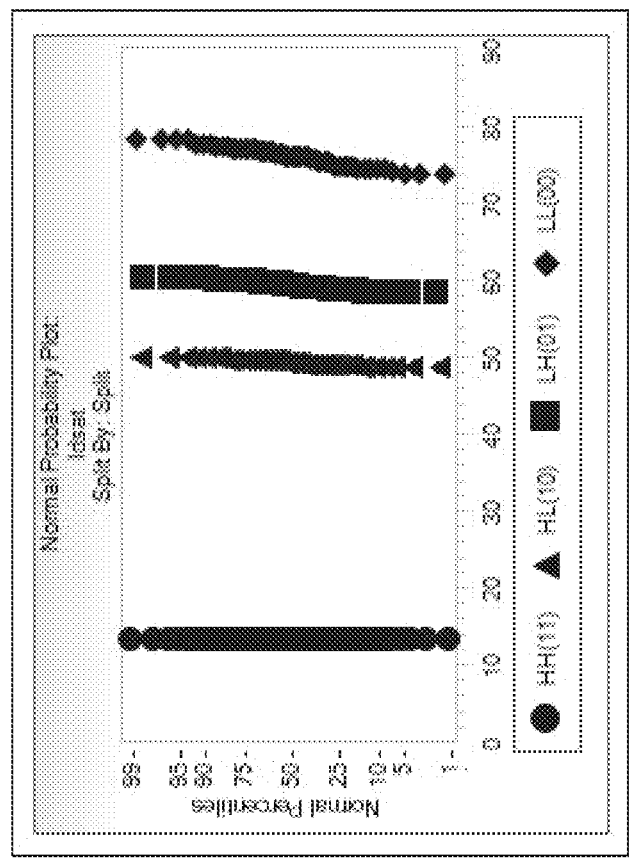
FIGS. 3A and 3B show normal probability plots of the read current of the prior art ReRAM of FIGS. 1A to 1B and the memory device of FIGS. 2A to 2D respectively.
Figure 3A:
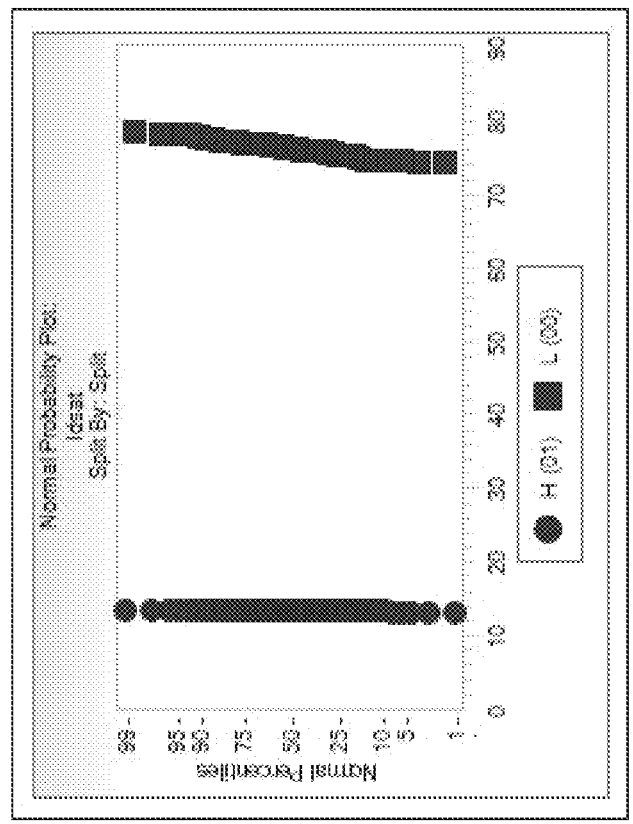

FIGS. 3A and 3B show the normal probability plots of the read current (Iread) for the prior art ReRAM 100 and the memory device 200 respectively. The read current (Iread) may correspond to the resistance of the resistive unit 110, 210, 211 (Res) through which the read current (Iread) flows since this resistance (Res) may be expressed in the form of the following equation: Vdd/Iread=Res. The normal probability plots of FIGS. 3A and 3B are obtained via Monte Carlo simulation of the ReRAM 100 and memory device 200. As shown in FIGS. 3A and 3B, while the prior art ReRAM 100 is switchable between only two states H(01) and L(00), the memory device 200 is switchable between four states LL(00), LH(01), HL(10) and HH(11) with a sufficiently wide cell window (said differently, the spacing between each state and its adjacent states is sufficiently wide). In a non-limiting embodiment, the cell window is larger when the first conductivity region 220 is a drain region and the second conductivity region 222 is a source region, than when the first conductivity region 220 is a source region and the second conductivity region 222 is a drain region.

FIGS. 4A to 4D show perspective views that illustrate a method for fabricating the memory device 200 according to a non-limiting embodiment of the present invention.

Figure 4A:
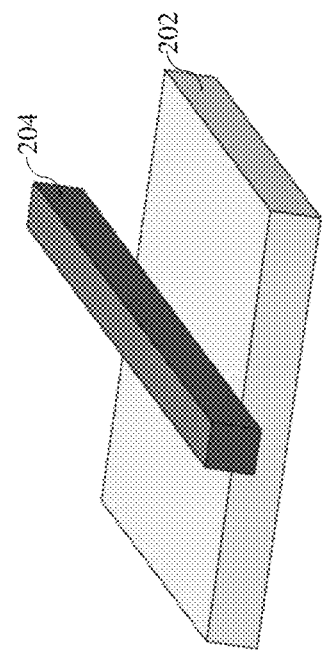
FIGS. 4A to 4D show perspective views that illustrate a method for fabricating the memory device of FIGS. 2A to 2D according to a non-limiting embodiment of the present invention.

Referring to FIG. 4A, according to a non-limiting embodiment, a method for fabricating the memory device 200 may begin by providing the substrate 202, forming the first voltage line 204 over the substrate 202, and forming the first conductivity region 220 and the second conductivity region 222 at least partially within the substrate 202. The first voltage line 204, and the first and second conductivity regions 220, 222 may be formed using a conventional front end of line (FEOL) process as known to those skilled in the art. However, other techniques as known to those skilled in the art may also be useful for forming the first voltage line 204 and the first and second conductivity regions 220, 222.

Figure 4B:
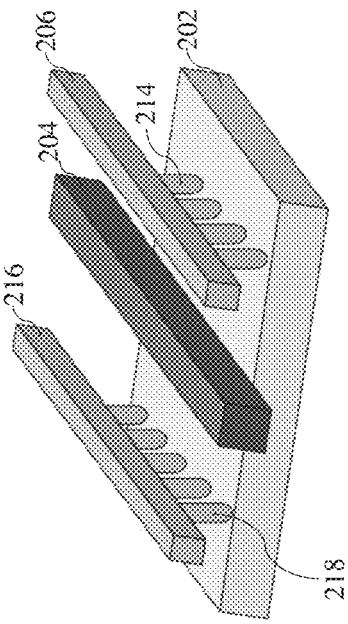

Referring to FIG. 4B, in a non-limiting embodiment, the method may further include forming the first contact plugs 214 over the substrate 202 with the first contact plugs 214 connected to the first conductivity region 220, forming the second contact plugs 218 over the substrate 202 with the second contact plugs 218 connected to the second conductivity region 222, forming the second voltage line 206 over the substrate 202 with the second voltage line 206 connected to the first contact plugs 214 and forming the conductive line 216 over the substrate 202 with the conductive line 216 connected to the second contact plugs 218. The first and second contact plugs 214, 218, the second voltage line 206 and the conductive line 216 may be formed by depositing insulating layers (such as, but not limited to, silicon oxide layers) over the substrate 202, etching the insulating layers to form openings or trenches using for example, photoresist masks and filling the openings or trenches with conductive material (such as, but not limited to, silver, copper, gold, aluminium, alloys thereof or combinations thereof) as known to those skilled in the art. However, other techniques as known to those skilled in the art may also be useful for forming the contact plugs 214, 218, the second voltage line 206 and the conductive line 216.

Figure 4C:
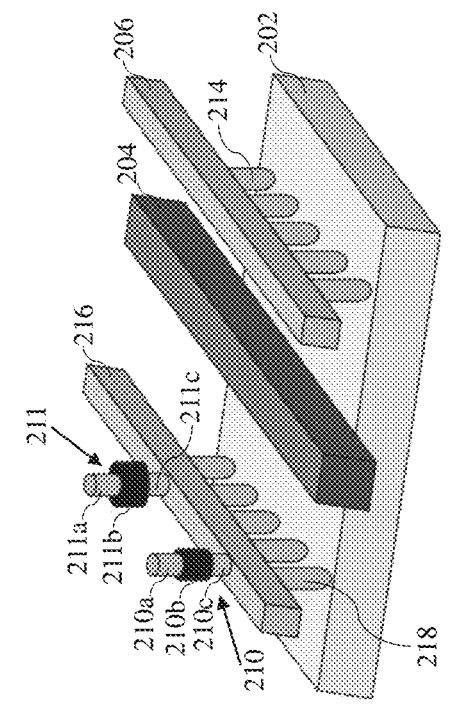

Referring to FIG. 4C, the method may further include forming the first and second resistive units 210, 211 over the substrate 202. In a non-limiting embodiment, the first resistive unit 210 and the second resistive unit 211 may be formed simultaneously over the second conductivity region 222. Forming the first resistive unit 210 and the second resistive unit 211 simultaneously helps to simplify the fabrication of the memory device 200 and reduce manufacturing costs. For example, a first conductive layer may be deposited over the substrate 202. A mask protecting regions of the first conductive layer intended for the first and second resistive units 210, 211 may be formed over the first conductive layer and exposed portions of the first conductive layer may be etched. An oxidation step may be performed to oxidise part of the remaining regions of the first conductive layer to form the first and second resistive layers 210*b*, 211*b*, and the first and second bottom electrodes 210*c*, 211*c*. A second conductive layer may be formed over the oxidised regions of the first conductive layer, and etched using another mask to form the first and second top electrodes 210*a*, 211*a*. However, other techniques as known to those skilled in the art may also be useful for forming the first and second resistive units 210, 211. Further, the first and second resistive units 210, 211 need not be formed simultaneously and in other non-limiting embodiments, either the first resistive unit 210 may be formed before the second resistive unit 211 or the second resistive unit 211 may be formed before the first resistive unit 210.

Figure 4D:
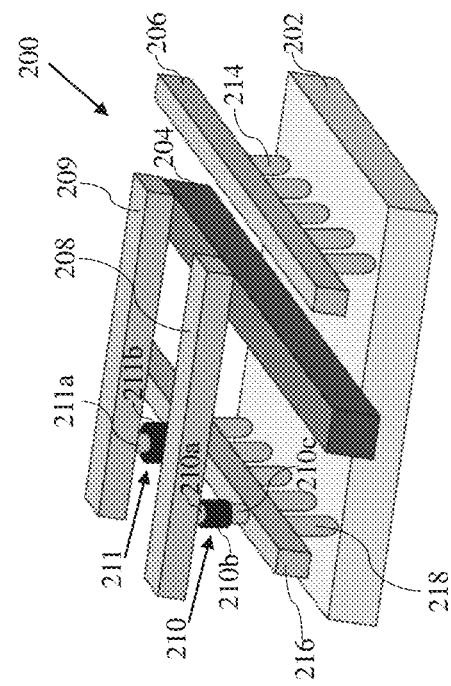

Referring to FIG. 4D, the method may further include forming the third voltage line 208 over the first resistive unit 210 and the fourth voltage line 209 over the second resistive unit 211. In a non-limiting embodiment, the third and fourth voltage lines 208, 209 may be formed simultaneously. Forming the third and fourth voltage lines 208, 209 simultaneously helps to simplify the fabrication process of the memory device 200 and reduce manufacturing costs. For example, an insulating layer (such as, but not limited to, a silicon oxide layer) may be deposited over substrate 202 and etched using a mask to form openings for the third and fourth voltage lines 208, 209, and the openings may be filled with conductive material (such as, but not limited to, silver, copper, gold, aluminium, alloys thereof or combinations thereof) to form the third and fourth voltage lines 208, 209. However, other techniques as known to those skilled in the art may also be useful for forming the third and fourth voltage lines 208, 209. Further, the third and fourth voltage lines 208, 209 need not be formed simultaneously and in other non-limiting embodiments, either the third voltage line 208 may be formed before the fourth voltage line 209 or the fourth voltage line 209 may be formed before the third voltage line 208.

Although not shown in the figures, the method may further include forming further contact plugs and conductive lines, and a passivation layer to protect the memory device 200. The further contact plugs, conductive lines and passivation layer may be formed using a conventional BEOL process as known to those skilled in the art but other techniques as known to those skilled in the art may also be useful.

The above described order of the steps for the method is only intended to be illustrative, and the steps of the method of the present invention are not limited to the above specifically described order unless otherwise specifically stated.

Figure 5:
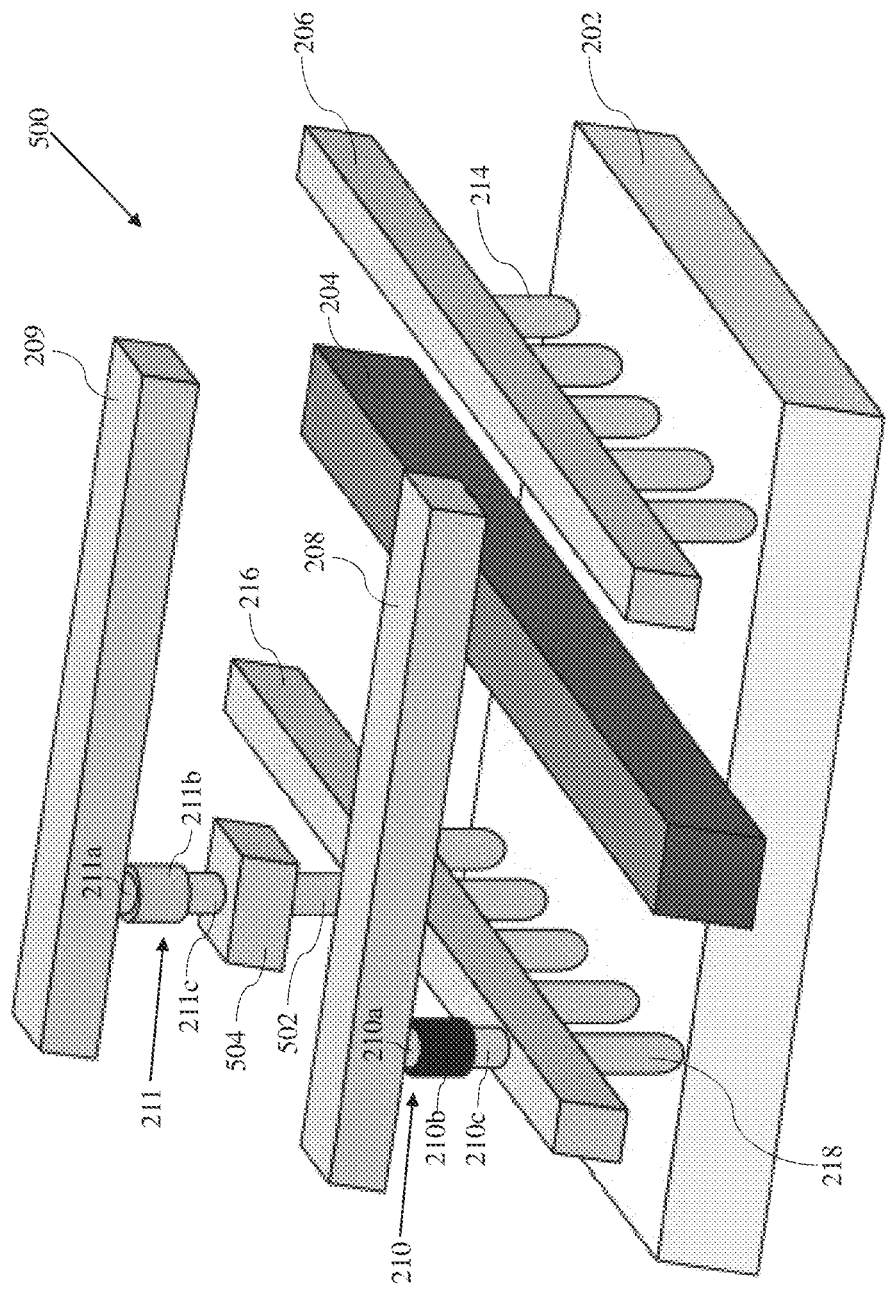
FIG. 5 shows a perspective view of a memory device according to an alternative non-limiting embodiment of the present invention.

FIG. 5 shows a memory device 500 according to an alternative non-limiting embodiment of the present invention. Memory device 500 is similar to memory device 200, and thus the common features are labelled with the same reference numerals and need not be discussed.

As shown in FIG. 5, the memory device 500 also includes a first resistive unit 210 and a second resistive unit 211, where the first resistive unit 210 includes a first resistive layer 210b arranged between a first top electrode 210a and a first bottom electrode 210c and the second resistive unit 211 includes a second resistive layer 211b arranged between a second top electrode 211a and a second bottom electrode 211c. Similar to the arrangement of the first resistive unit 210 of the memory device 200, the first resistive unit 210 of the memory device 500 may be arranged between the conductive line 216 and the third voltage line 208. However, the memory device 500 may further include a third contact plug 502 arranged over the conductive line 216 and a conductive element 504 arranged over the third contact plug 502. The second resistive unit 211 of the memory device 500 may be connected to the conductive element 504 and may be arranged between the conductive element 504 and the fourth voltage line 209.

In a non-limiting embodiment as shown in FIG. 5, the first and second resistive layers 210b, 211b may both have a cylindrical shape, and a diameter of the first resistive layer 210b of the first resistive unit 210 may be approximately equal to a diameter of the second resistive layer 211b of the second resistive unit 211. Further, the first resistive unit 210 may be formed from a first material, the second resistive unit 211 may be formed from a second material, and the first material may be different from the second material. For example, the first resistive layer 210b of the first resistive unit 210 and the second resistive layer 211b of the second resistive unit 211 may be formed from different materials. The first and second top electrodes 210a, 211a of the first and second resistive units 210, 211 respectively may be formed of the same material or of different materials. Similarly, the first and second bottom electrodes 210c, 211c of the first and second resistive units 210, 211 respectively may be formed of the same material or of different materials. When the first and second resistive layers 210b, 211b are formed of different materials, the first resistance value (LR1) of the first resistive unit 210 may be different from the third resistance value (LR2) of the second resistive unit 211 and the second resistance value (HR1) of the first resistive unit 210 may be different from the fourth resistance value (HR2) of the second resistive unit 211. In a non-limiting embodiment, the first and second resistive layers 210b, 211b may include transition metal oxide, such as, but not limited to, tantalum oxide ($TaO_x$), titanium oxide ($TiO_x$), titanium oxynitride (TiON), silicon oxide ($SiO_x$), aluminium oxide ($AlO_x$), niobium oxide ($NbO_x$), hafnium oxide ($HfO_x$) and combinations thereof. In a non-limiting embodiment, the first and second top electrodes 210a, 211a, and the first and second bottom electrodes 210c, 211c may be formed of platinum, iridium, tantalum, titanium nitride, alloys thereof or combinations thereof. Other types of materials as known to those skilled in the art may also be useful for forming the first and second resistive layers 210b, 211b, the first and second top electrodes 210a, 211a and the first and second bottom electrodes 210c, 211c of the memory device 500.

In various non-limiting embodiments, a diameter of the first resistive layer 210b of the first resistive unit 210 may be different from a diameter of the second resistive layer 211b of the second resistive unit 211. The first and second resistive layers 210b, 211b may be formed of the same material, and the memory device may have a structure similar to that of the memory device 200 or a structure similar to that of the memory device 500. In various non-limiting embodiments, a diameter of the first resistive layer 210b of the first resistive unit 210 may be approximately equal to a diameter of the second resistive layer 211b of the second resistive unit 211, the first and second resistive layers 210b, 211b may be formed of different materials, and the memory device may have a structure similar to that of the memory device 200 (but the resistive units 210, 211 may not be formed simultaneously in the fabrication process) or a structure similar to that of the memory device 500. In other non-limiting embodiments, a diameter of the first resistive layer 210b of the first resistive unit 210 may be different from a diameter of the second resistive layer 211b of the second resistive unit 211, and the first and second resistive layers 210b, 211b may be formed of different materials, and the memory device may have a structure similar to that of the memory device 200 (but the resistive units 210, 211 may not be formed simultaneously in the fabrication process) or a structure similar to that of the memory device 500.

FIGS. 6A-6F show perspective views that illustrate a method for fabricating the memory device 500 according to a non-limiting embodiment of the present invention.

Referring to FIG. 6A, according to a non-limiting embodiment, a method for fabricating the memory device 500 may begin by providing the substrate 202, forming the first voltage line 204 over the substrate 202, and forming the first conductivity region 220 and the second conductivity region 222 at least partially within the substrate 202. The first voltage line 204, and the first and second conductivity regions 220, 222 may be formed using a conventional front end of line (FEOL) process as known to those skilled in the art. However, other techniques as known to those skilled in the art may also be useful for forming the first voltage line 204 and the first and second conductivity regions 220, 222.

Referring to FIG. 6B, in a non-limiting embodiment, the method may further include forming the first contact plugs 214 over the substrate 202 with the first contact plugs 214 connected to the first conductivity region 220, forming the second contact plugs 218 over the substrate 202 with the second contact plugs 218 connected to the second conductivity region 222, forming the second voltage line 206 over the substrate 202 with the second voltage line 206 connected to the first contact plugs 214 and forming the conductive line 216 over the substrate 202 with the conductive line 216 connected to the second contact plugs 218. The first and second contact plugs 214, 218, the second voltage line 206 and the conductive line 216 may be formed by depositing insulating layers (such as, but not limited to, silicon oxide layers), etching the insulating layers to form openings or trenches using for example, photoresist masks and filling the openings or trenches with conductive material (such as, but not limited to, silver, copper, gold, aluminium, alloys thereof or combinations thereof) as known to those skilled in the art. However, other techniques as known to those skilled in the art may also be useful for forming the contact plugs 214, 218, the second voltage line 206 and the conductive line 216.

Referring to FIG. 6C, the method may further include forming the first resistive unit 210 over the second conductivity region 222 and forming the third contact plug 502. To form the first resistive unit 210 and the third contact plug 502, a first conductive layer may be formed over the substrate 202, and a mask protecting regions of the first conductive layer intended for the first resistive unit 210 and the third contact plug 502 may then be formed over the first conductive layer. Exposed portions of the first conductive layer may then be etched to form the third contact plug 502 and an intermediate first resistive unit. An oxidation step may be performed to oxidise the intermediate first resistive unit to form the first resistive layer 210b and the first bottom electrode 210c of the first resistive unit 210. A second conductive layer may then be formed over the oxidised region of the intermediate first resistive unit and etched using another mask to form the first top electrode 210a. However, other techniques as known to those skilled in the art may also be useful for forming the first resistive unit 210 and the third contact plug 502.

Referring to FIG. 6D, the method may further include forming the third voltage line 208 over the first resistive unit 210 and forming the conductive element 504. In a non-limiting example, an insulating layer (such as, but not limited to, a silicon oxide layer) may be deposited over substrate 202 and etched using a mask to form openings for the third voltage line 208 and the conductive element 504. The openings may then be filled with conductive material (such as, but not limited to, silver, copper, gold, aluminium, alloys thereof or combinations thereof) to form the third voltage line 208 and the conductive element 504. However, other techniques as known to those skilled in the art may also be useful for forming the third voltage line 208 and the conductive element 504.

Referring to FIG. 6E, the method may further include forming the second resistive unit 211 over the second conductivity region 222 (e.g. over the conductive element 504). In a non-limiting embodiment, a first conductive layer may be formed over the substrate 202 and a mask protecting regions of the first conductive layer intended for the second resistive unit 211 may be formed over the first conductive layer. Exposed portions of the first conductive layer may be etched to form an intermediate second resistive unit and an oxidation step may be performed to oxidise the intermediate second resistive unit to form the second resistive layer 211b and the second bottom electrode 211c. A second conductive layer may then be formed over the oxidised region of the intermediate second resistive unit, and etched using another mask to form the second top electrode 211a. However, other techniques as known to those skilled in the art may also be useful for forming the second resistive unit 211.

Referring to FIG. 6F, the method may further include forming the fourth voltage line 209 over the second resistive unit 211. In a non-limiting embodiment, an insulating layer (such as, but not limited to, a silicon oxide layer) may be formed over the substrate 202 and etched using a mask to form an opening for the fourth voltage line 209, and the opening may be filled with conductive material (such as, but not limited to, silver, copper, gold, aluminium, alloys thereof or combinations thereof) to form the fourth voltage line 209. However, other techniques as known to those skilled in the art may also be useful for forming the fourth voltage line 209.

Although not shown in the figures, the method may further include forming further contact plugs and conductive lines, and a passivation layer to protect the memory device 500. The further contact plugs, conductive lines and passivation layer may be formed using a conventional BEOL process as known to those skilled in the art but other techniques as known to those skilled in the art may also be useful.

The above described order of the steps for the method is only intended to be illustrative, and the steps of the method of the present invention are not limited to the above specifically described order unless otherwise specifically stated.

In various non-limiting embodiments, the memory device 200/500 may include two or more resistive units. For example, the memory device 200/500 may include not only the first resistive unit 210 and the second resistive unit 211, but also further resistive units that may be arranged between further voltage lines and the second conductivity region 222. Each further resistive unit may have a resistance switchable between a lower resistance value and a higher resistance value. For each resistive unit (including the first and second resistive units 210, 211), its lower resistance value may be different from the lower resistance value of at least one other resistive unit and/or its higher resistance value may be different from the higher resistance value of at least one other resistive unit. A memory device 200/500 with a number of resistive units greater than two may be switchable between more than four states. In various non-limiting embodiments, a memory device 200/500 with a number of resistive units equal to N may be switchable between $2^N$ states and the memory device 200/500 may be read by identifying the state the memory device 200/500 is in. In various non-limiting embodiments, the memory device 200/500 which may be capable of storing more than one bit of information (as it may be switchable between more than two states) can be fabricated at a negligible additional processing cost and with a same footprint or negligible increase in footprint as compared to a prior art memory device capable of storing only one bit of information.

A memory cell including a plurality of memory devices (where each memory device may, for example, be memory device 200 or memory device 500) may be provided. For each memory device 200/500 in the memory cell, either the first conductivity region 220 may include a drain region and the second conductivity region 222 may include a source region, or the first conductivity region 220 may include a source region and the second conductivity region 222 may include a drain region.

Figure 7A:
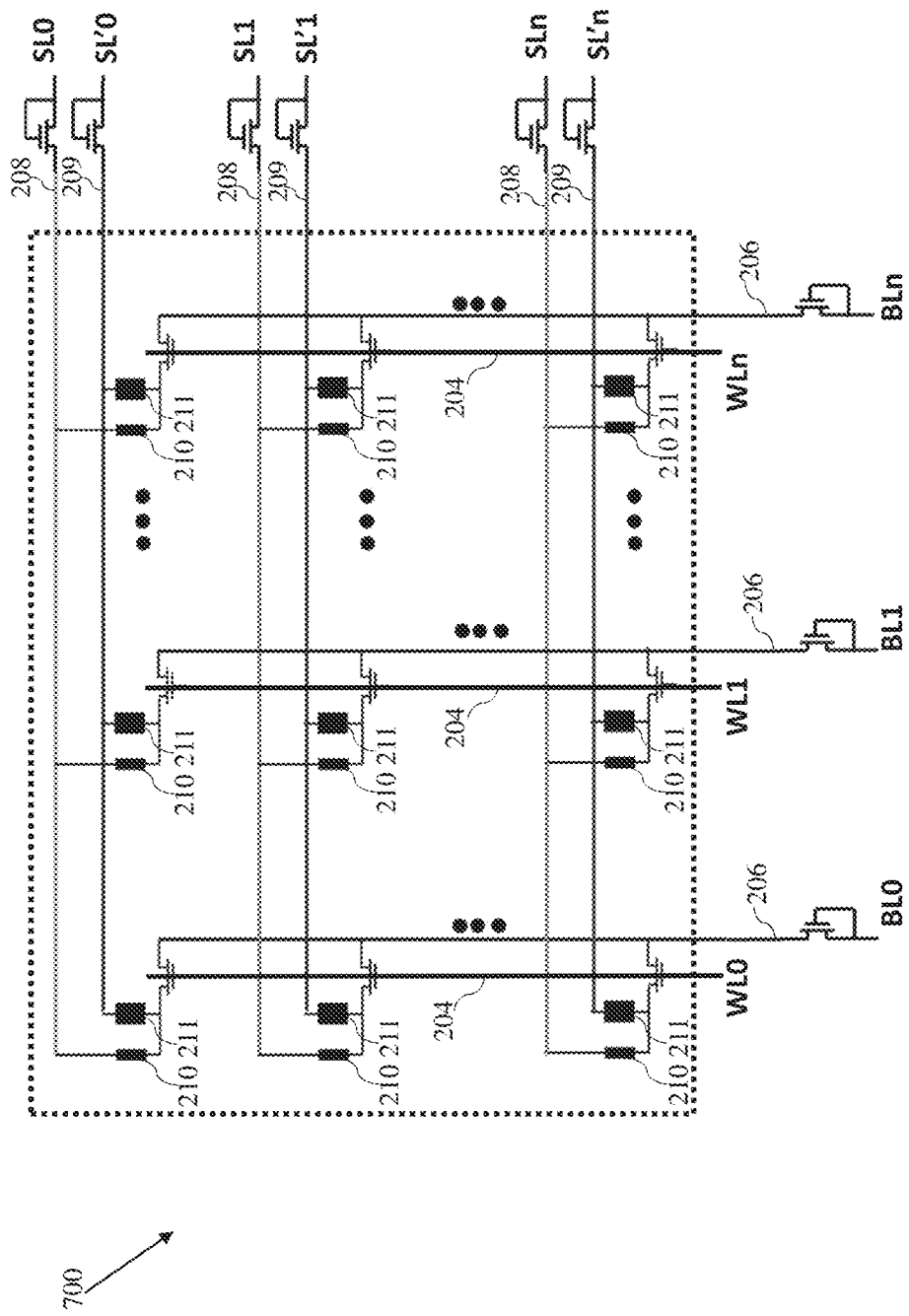
FIG. 7A shows a memory cell including a plurality of memory devices of FIGS. 2A to 2D according to a non-limiting embodiment of the present invention and FIG. 7B shows a top view of two of the memory devices of the memory cell of FIG. 7A.
Figure 7B:
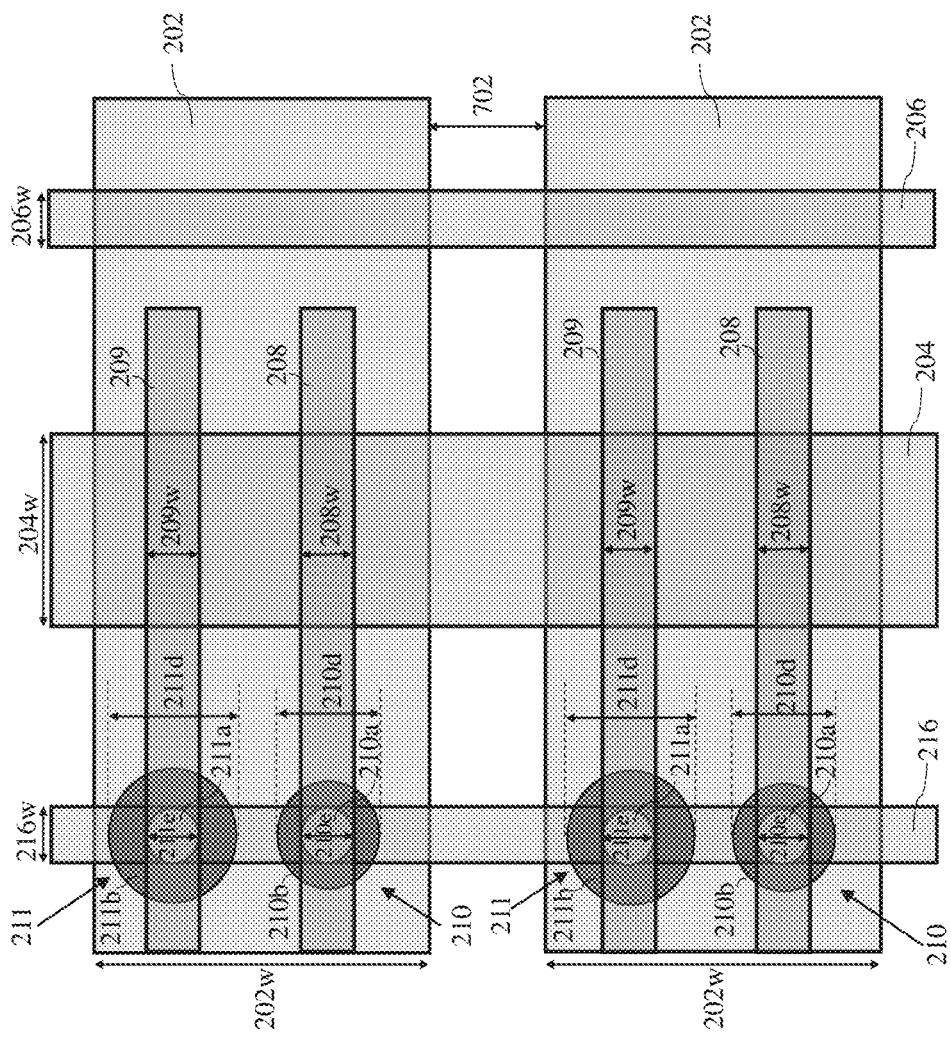

For example, FIG. 7A shows an equivalent circuit of a memory cell 700 including a plurality of memory devices 200 according to a non-limiting embodiment of the present invention and FIG. 7B shows a top view of two of the memory devices 200 in the memory cell 700. The memory cell 700 may also be referred to as a sneak-current-free array. In the non-limiting embodiment as shown in FIGS. 7A and 7B, the first conductivity region 220 of each memory device 200 includes a drain region and the second conductivity region 222 of each memory device 200 includes a source region. In the memory cell 700, the memory devices 200 may be arranged in a plurality of columns and rows. The memory devices 200 arranged in a same column may share a common first voltage line 204 which may be a word line (e.g. WL0, WL1, WLn) and a common second voltage line 206 which may be a bit line (e.g. BL0, BL1, BL2). The memory devices 200 arranged in a same row may share a common third voltage line 208 which may be a first source line (e.g. SL, SL1, SL2) and a common fourth voltage line 209 which may be a second source line (e.g. SL', SL1', SL2'). As more clearly shown in FIG. 7B, the memory devices 200 may be spaced apart from each other by a distance 702 which may be about 0.07 um in a non-limiting embodiment and may range from about 2 nm to about 900 nm in alternative non-limiting embodiments.

The memory cell 700 may include only memory devices 500 in an alternative non-limiting embodiment, or may include both memory devices 200 and memory devices 500 in another alternative non-limiting embodiment. In various alternative non-limiting embodiments, the memory devices 200/500 may be arranged in a different manner from that shown in FIG. 7A and may not share common voltage lines. In addition, the memory cell 700 may include some memory devices 200/500 with the first conductivity region 220 including a drain region and the second conductivity region 222 including a source region, and some memory devices 200/500 with the first conductivity region 220 including a source region and the second conductivity region 222 including a drain region.

In various alternative non-limiting embodiments, the resistive units 210, 211 may each be arranged nearer to the lengths of the substrate 202 (in other words, further away from each other in a direction along a length of the conductive line 216) such that at least a portion of one or both of the resistive units 210, 211 extend beyond the substrate 202. In a non-limiting example, the at least a portion of one or both of the resistive units 210, 211 may extend beyond the substrate 202 by a length of approximately 0.045 um.

In various alternative non-limiting embodiments, the resistive units 210, 211 of the memory device 200/500 may instead include magnetic tunnel junctions and the memory device 200/500 may be a MRAM instead of a ReRAM. Alternatively, the resistive units 210, 211 may instead include phase-change materials sandwiched between top and bottom electrodes and the memory device 200/500 may be a PCRAM instead of a ReRAM. In yet alternative non-limiting embodiments, the memory device 200/500 may be any other resistive-based non-volatile memory where the resistances of the resistive units 210, 211 may be switched by applying appropriate voltages between the second voltage line 206 and the third and fourth voltage lines 208, 209. In various non-limiting embodiments, a memory cell similar to the memory cell 700 shown in FIG. 7 may be provided, where the memory cell may include one or more of ReRAMs, MRAMs and PCRAMs having the structure as shown in FIGS. 2A to 2D or the structure as shown in FIG. 5.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
a substrate comprising a first conductivity region and a second conductivity region at least partially arranged within the substrate, and a channel region arranged between the first conductivity region and the second conductivity region;
a first voltage line arranged over the channel region;
a second voltage line electrically coupled to the first conductivity region;
a third voltage line and a fourth voltage line electrically coupled to the second conductivity region; and
two or more resistive units comprising a first resistive unit and a second resistive unit, wherein the first resistive unit is arranged between the third voltage line and the second conductivity region, and wherein the second resistive unit is arranged between the fourth voltage line and the second conductivity region;
wherein the first resistive unit has a first diameter, and the second resistive unit has a second diameter, and wherein the first diameter is different from the second diameter;
wherein the first resistive unit has a resistance configured to switch between a first resistance value and a second resistance value in response to a change in voltage applied between the second voltage line and the third voltage line, wherein the first resistance value is lower than the second resistance value;
wherein the second resistive unit has a resistance configured to switch between a third resistance value and a fourth resistance value in response to a change in voltage applied between the second voltage line and the fourth voltage line, wherein the third resistance value is lower than the fourth resistance value; and
wherein (a) the first resistance value is different from the third resistance value; and/or (b) the second resistance value is different from the fourth resistance value.

2. The memory device according to claim 1, wherein the first conductivity region comprises a drain region, and wherein the second conductivity region comprises a source region.

3. The memory device according to claim 1, wherein the first conductivity region comprises a source region, and wherein the second conductivity region comprises a drain region.

4. The memory device according to claim 1, wherein the second resistance value is different from the fourth resistance value, and wherein the first resistance value is approximately equal to the third resistance value.

5. The memory device according to claim 1, wherein the first resistance value is different from the third resistance value, and wherein the second resistance value is different from the fourth resistance value.

6. The memory device according to claim 1, wherein the first resistive unit is formed from a first material, and the second resistive unit is formed from a second material, and wherein the first material is different from the second material.

7. The memory device according to claim 1, wherein the first resistive unit comprises a first top electrode, a first bottom electrode and a first resistive layer between the first top electrode and the first bottom electrode, and the second resistive unit comprises a second top electrode, a second bottom electrode and a second resistive layer between the second top electrode and the second bottom electrode.

8. The memory device according to claim 7, wherein the first diameter is a diameter of the first resistive layer and the second diameter is a diameter of the second resistive layer.

9. The memory device according to claim 8, wherein the first top electrode, the second top electrode, the first bottom electrode and the second bottom electrode have approximately a same diameter.

10. The memory device according to claim 7, wherein the first resistive layer is formed from a first material, and the second resistive layer is formed from a second material, and wherein the first material is different from the second material.

11. The memory device according to claim 10, wherein the first top electrode, the second top electrode, the first bottom electrode and the second bottom electrode are formed of a same material.

12. The memory device according to claim 1, further comprising a conductive line arranged between the first resistive unit and the second conductivity region, and between the second resistive unit and the second conductivity region.

13. The memory device according to claim 12, wherein the memory device further comprises a conductive element arranged between the second resistive unit and the conductive line, and wherein the first resistive unit is in direct contact with the conductive line.

14. The memory device according to claim 1, wherein the memory device comprises a resistive random access memory device, a magnetic random access memory device or a phase-change magnetic random access memory device.

15. A memory cell comprising a plurality of memory devices, each memory device comprising:
    a substrate comprising a first conductivity region and a second conductivity region at least partially arranged within the substrate, and a channel region arranged between the first conductivity region and the second conductivity region;
    a first voltage line arranged over the channel region;
    a second voltage line electrically coupled to the first conductivity region;
    a third voltage line and a fourth voltage line electrically coupled to the second conductivity region; and
    two or more resistive units comprising a first resistive unit and a second resistive unit, wherein the first resistive unit is arranged between the third voltage line and the second conductivity region, and wherein the second resistive unit is arranged between the fourth voltage line and the second conductivity region;
    wherein the first resistive unit has a first diameter, and the second resistive unit has a second diameter, and wherein the first diameter is different from the second diameter;
    wherein the first resistive unit has a resistance configured to switch between a first resistance value and a second resistance value in response to a change in voltage applied between the second voltage line and the third voltage line, wherein the first resistance value is lower than the second resistance value;
    wherein the second resistive unit has a resistance configured to switch between a third resistance value and a fourth resistance value in response to a change in voltage applied between the second voltage line and the fourth voltage line, wherein the third resistance value is lower than the fourth resistance value; and
    wherein (a) the first resistance value is different from the third resistance value; and/or (b) the second resistance value is different from the fourth resistance value.

16. The memory cell according to claim 15, wherein for each memory device, either the first conductivity region comprises a drain region and the second conductivity region comprises a source region, or the first conductivity region comprises a source region and the second conductivity region comprises a drain region.

17. The memory cell according to claim 15, wherein for one or more of the memory devices, the first resistive unit is formed from a first material, the second resistive unit is formed from a second material, and wherein the first material is different from the second material.

18. A memory device comprising:
    a substrate comprising a first conductivity region and a second conductivity region at least partially arranged within the substrate, and a channel region arranged between the first conductivity region and the second conductivity region;
    a first voltage line arranged over the channel region;
    a second voltage line electrically coupled to the first conductivity region;
    a third voltage line and a fourth voltage line electrically coupled to the second conductivity region; and
    two or more resistive units comprising a first resistive unit and a second resistive unit, wherein the first resistive unit is arranged between the third voltage line and the second conductivity region, and wherein the second resistive unit is arranged between the fourth voltage line and the second conductivity region;
    a conductive line arranged between the first resistive unit and the second conductivity region, and between the second resistive unit and the second conductivity region, wherein the first resistive unit is in direct contact with the conductive line;
    a conductive element arranged between the second resistive unit and the conductive line;
    wherein the first resistive unit has a resistance configured to switch between a first resistance value and a second resistance value in response to a change in voltage applied between the second voltage line and the third voltage line, wherein the first resistance value is lower than the second resistance value;
    wherein the second resistive unit has a resistance configured to switch between a third resistance value and a fourth resistance value in response to a change in voltage applied between the second voltage line and the fourth voltage line, wherein the third resistance value is lower than the fourth resistance value; and
    wherein (a) the first resistance value is different from the third resistance value; and/or (b) the second resistance value is different from the fourth resistance value.

* * * * *